United States Patent
Zhao et al.

(10) Patent No.: US 12,082,353 B2
(45) Date of Patent: Sep. 3, 2024

(54) SPLICING DISPLAY DEVICE

(71) Applicant: TCL CHINA STAR OPTOELECTRONICS TECHNOLOGY CO., LTD., Guangdong (CN)

(72) Inventors: Guanqiao Zhao, Guangdong (CN); Zhongyin Lu, Guangdong (CN); Lijian Xiao, Guangdong (CN)

(73) Assignee: TCL CHINA STAR OPTOELECTRONICS TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 17/754,384

(22) PCT Filed: Mar. 15, 2022

(86) PCT No.: PCT/CN2022/080852
§ 371 (c)(1),
(2) Date: Mar. 31, 2022

(87) PCT Pub. No.: WO2023/164975
PCT Pub. Date: Sep. 7, 2023

(65) Prior Publication Data
US 2024/0114634 A1    Apr. 4, 2024

(30) Foreign Application Priority Data

Mar. 2, 2022  (CN) .......................... 202210197230.6

(51) Int. Cl.
*H05K 5/00* (2006.01)
*G09F 9/302* (2006.01)

(52) U.S. Cl.
CPC .......... *H05K 5/0021* (2013.01); *G09F 9/3023* (2013.01); *G09F 9/3026* (2013.01)

(58) Field of Classification Search
CPC .. H05K 5/0021; H05K 5/0017; G09F 9/3026; G09F 9/3023
USPC .......................... 361/730, 728, 807, 809, 810
See application file for complete search history.

(56) References Cited

U.S. PATENT DOCUMENTS

| | | | |
|---|---|---|---|
| 8,218,325 B2 * | 7/2012 | Song | H05K 1/0203 361/752 |
| 10,273,994 B1 * | 4/2019 | Foster | G09F 9/3026 |
| 11,871,528 B1 * | 1/2024 | Xu | H05K 5/0217 |

FOREIGN PATENT DOCUMENTS

| | | | | |
|---|---|---|---|---|
| CN | 203351138 | * | 12/2013 | ............... G09F 9/33 |
| CN | 211062385 U | | 7/2020 | |
| CN | 213123600 U | | 5/2021 | |
| CN | 213241748 U | | 5/2021 | |
| CN | 213545785 U | | 6/2021 | |
| CN | 214757290 U | | 11/2021 | |
| CN | 215643475 U | | 1/2022 | |
| CN | 215643496 U | | 1/2022 | |

(Continued)

*Primary Examiner* — Hung S. Bui

(57) ABSTRACT

The present application provides a splicing display device, which comprises a box body, a bracket, a plurality of display panels, a plurality of panel fixing members, and a plurality of bracket fixing members. The bracket is detachably disposed on the box body. The plurality of display panels are detachably disposed on the bracket. The plurality of panel fixing members fix the display panel and the bracket. The plurality of bracket fixing members fix the bracket and the box body.

20 Claims, 7 Drawing Sheets

(56) References Cited

FOREIGN PATENT DOCUMENTS

| | | |
|---|---|---|
| CN | 114120845 A | 3/2022 |
| JP | 2007334244 A | 12/2007 |
| WO | 2013071624 A1 | 5/2013 |
| WO | 2014103870 A1 | 7/2014 |

* cited by examiner

SPLICING DISPLAY DEVICE

TECHNICAL FIELD

The present application relates to a technical field of display, and in particular, to a splicing display device.

BACKGROUND

Due to limitations of current technology, a splicing display is required when large-size display is carried out by using a display screen. A splicing display device is formed by assembling one or more box bodies, each of which is provided with a plurality of display screens. A splicing display device may be installed on a wall surface, with one side provided with a display screen facing the audience, and one side provided with a box body facing the wall. A plurality of display panels of a known splicing display device are directly disposed on a box body. In order to dispose a display panel, especially a small-size display panel, on a box body, and ensure flatness among the plurality of display panels, a plurality of supporting columns need to be formed on the box body. For example, in order to fix a display panel, correspondingly, six supporting columns may need to be formed on the box body. If there are too many supporting columns, they will interfere with components in the box body.

Technical Problem

The present application provides a splicing display device capable of reducing a number of supporting columns on a box body and preventing interference between the supporting columns and components in the box body.

Technical Solutions

The present application provides a splicing display device, comprising:
- a box body;
- a bracket detachably disposed on the box body;
- a plurality of display panels detachably disposed on the bracket;
- a plurality of panel fixing members for fixing the display panels and the bracket; and
- a plurality of bracket fixing members for fixing the bracket and the box body.

Optionally, in an embodiment, the plurality of panel fixing members comprise a first fixing member and a second fixing member, the first fixing member is detachably connected to the bracket fixing members, and the second fixing member is connected to only the display panels and the bracket.

Optionally, in an embodiment, the bracket comprises a main body portion and a peripheral portion disposed around the main body portion, the first fixing member is disposed at least at the peripheral portion of the bracket, and the second fixing member is disposed at least at the main body portion of the bracket.

Optionally, in an embodiment, a first mounting hole is formed on the bracket, and the display panel is formed with a second mounting hole corresponding to the first mounting hole, and the panel fixing members penetrate the first mounting hole and the second mounting hole to fix the display panel on the bracket.

Optionally, in an embodiment, the splicing display device further comprises an adapter plate disposed between the box body and the bracket, the bracket comprises a facing portion facing the adapter plate, the second fixing member fixes the facing portion and the plurality of display panels, and the second fixing member is located on one side of the adapter plate away from the box body.

Optionally, in an embodiment, the second fixing member and the adapter plate are disposed at intervals.

Optionally, in an embodiment, the box body comprises supporting columns, and the supporting columns are disposed in a manner of avoiding the adapter plate.

Optionally, in an embodiment, the supporting columns comprise a first supporting column disposed around the adapter plate.

Optionally, in an embodiment, the supporting columns comprise an auxiliary supporting column, the adapter plate is provided with at least one opening, and the first fixing member, the bracket fixing members, and the auxiliary supporting column are detachably connected in the at least one opening.

Optionally, in an embodiment, the adapter plate is detachably fixed on the bracket.

Optionally, in an embodiment, the box body comprises supporting columns, and the bracket fixing members are disposed on the supporting columns.

Optionally, in an embodiment, the box body comprises a bottom plate, the bottom plate comprises a body portion and a peripheral portion, and the peripheral portion surrounds the body portion, wherein the supporting columns comprise a first supporting column and a second supporting column, the first supporting column is disposed at the peripheral portion, and the second supporting column is disposed at the body portion.

Optionally, in an embodiment, the splicing display device further comprises an adapter plate disposed between the box body and the bracket, and the first supporting column and the second supporting column are disposed around the adapter plate.

Optionally, in an embodiment, the supporting columns comprise an auxiliary supporting column, the adapter plate is provided with at least one opening, and the panel fixing members, the bracket fixing members, and the auxiliary supporting column are detachably connected in the at least one opening.

Optionally, in an embodiment, the first fixing member and the bracket fixing members are magnetically connected.

Optionally, in an embodiment, the first fixing member is a screw and the bracket fixing members are magnets.

Optionally, in an embodiment, the second fixing member is a screw, the first fixing member has a length greater than that of the second fixing member, and the first fixing member has a nut diameter greater than that of the second fixing member.

Optionally, in an embodiment, the bracket comprises a plurality of first supporting strips and a plurality of second supporting strips intersecting the first supporting strips, the first supporting strips intersect the second supporting strips to form a plurality of supporting units, and the display panel is mounted on the supporting units.

Optionally, in an embodiment, the bracket fixing members have a number less than that of the panel fixing members.

Optionally, in an embodiment, the plurality of display panels are micro-light-emitting diode display panels or sub-millimeter light-emitting diode display panels, and the display panels have a size of 150×168.75, 150×112.5 or 150×56.25.

Technical Effects

According to the present application, by a bracket disposed between a box body and display panels, a plurality of the display panels are fixed on a bracket firstly, and then the bracket is integrally fixed on the box body. Since the bracket is formed as a whole, when fixing the bracket on the box body, the number of bracket fixing members needed is less than that of fixing members for fixing a plurality of display panels on the box body one by one. Therefore, the number of supporting columns on the box body for fixing the display panels can be correspondingly reduced, and interference between the supporting columns on the box body and other components can be avoided under the condition of fixing the display panels and ensuring the flatness among the plurality of display panels.

DETAILED DESCRIPTION

Hereinafter, technical solution in embodiments of the present application will be clearly and completely described with reference to the accompanying drawings in embodiments of the present application. Apparently, the described embodiments are part of, but not all of, the embodiments of the present application. All the other embodiments, obtained by a person with ordinary skill in the art on the basis of the embodiments in the present application without expenditure of creative labor, belong to the protection scope of the present application.

In the present application, unless otherwise specified and defined, a description that a first feature is "above" or "below" a second feature may include the condition that first feature and the second feature are connected directly, or may include the condition that the first feature and the second feature are not directly connected but contacted through an additional feature therebetween. Further, a description that the first feature is "above" the second feature includes the condition that the first feature is directly above and obliquely above the second feature, or only indicates that the first feature has a greater horizontal height than that of the second feature. A description that the first feature is "below" the second feature includes the condition that the first feature is directly below and obliquely below the second feature, or only indicates that the first feature has a less horizontal height than that of the second feature. In addition, the terms "first," "second" are used for descriptive purposes only and cannot be understood as indicating or implying relative importance or implicitly indicating the number of indicated technical features. Thus, the features defined by "first" and "second" may explicitly or implicitly include one or more features.

The present application provides a splicing display device 100. The splice display device 100 may be formed by assembling one or more box bodies 10a, each of which is provided with a plurality of display screens for large-size display. The splicing display device 100 may be mounted on a wall surface, with one side provided with a display screen facing the audience, and one side provided with a box body facing the wall.

Figure 1:
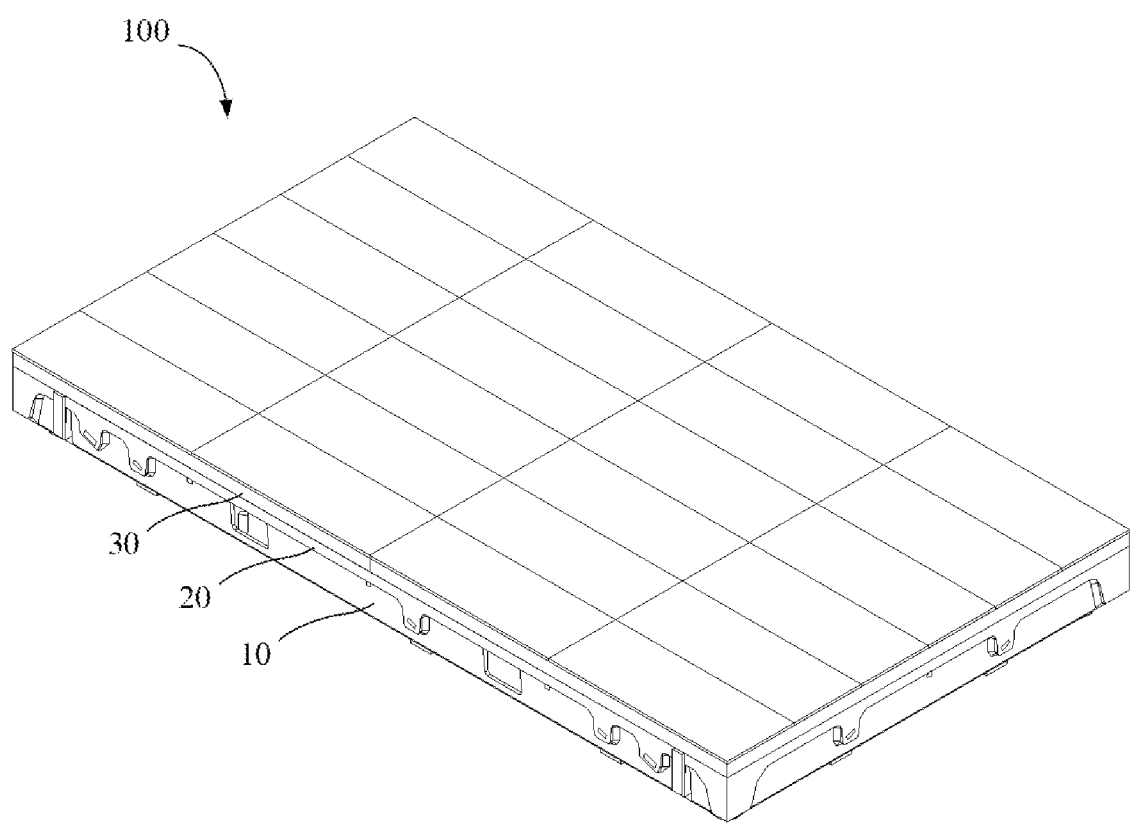
FIG. 1 is a three-dimensional schematic view of a splicing display device according to the present application.
Figure 2:
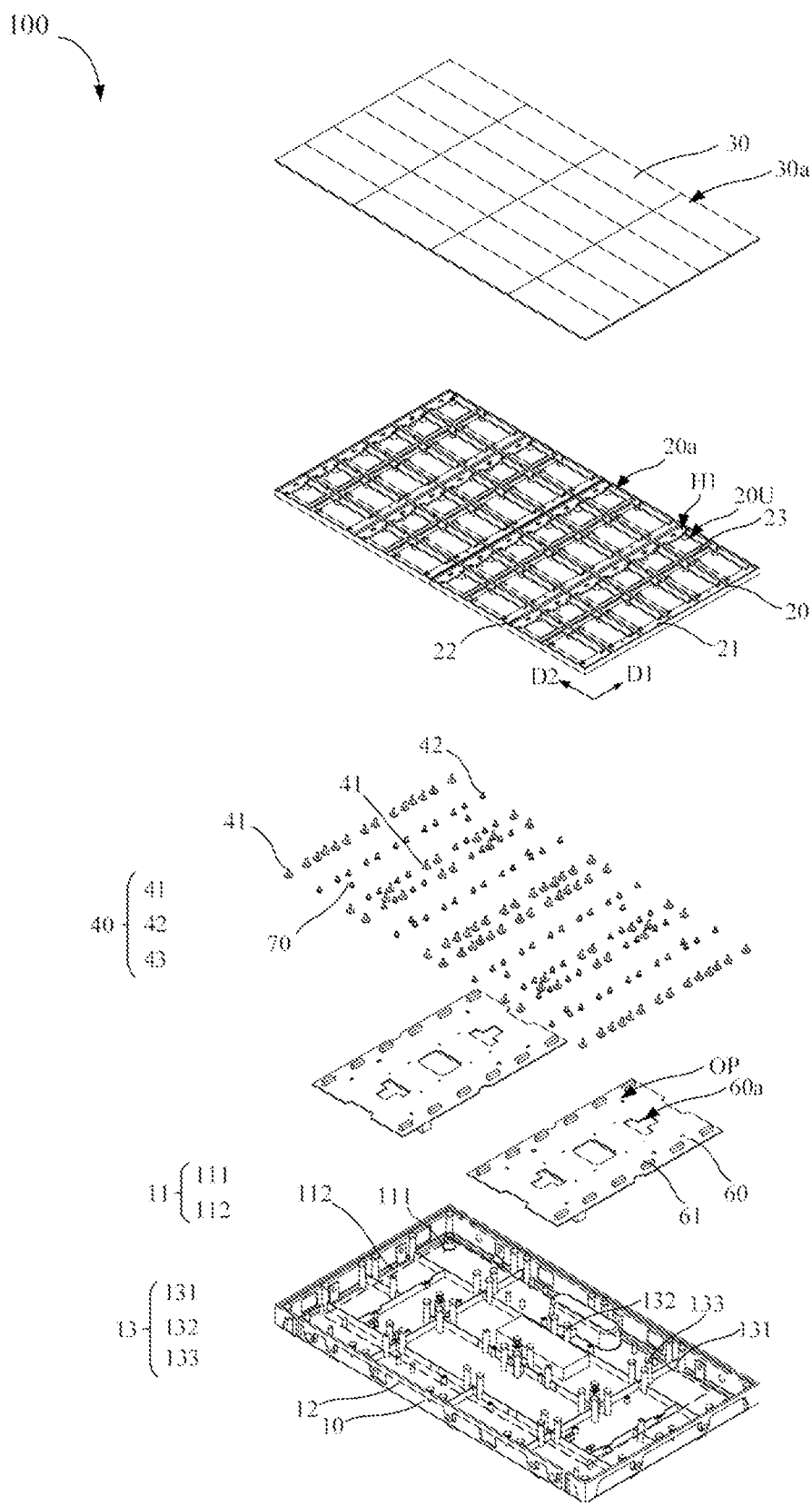
FIG. 2 is an exploded view from one angle of the splicing display of FIG. 1.
Figure 3:
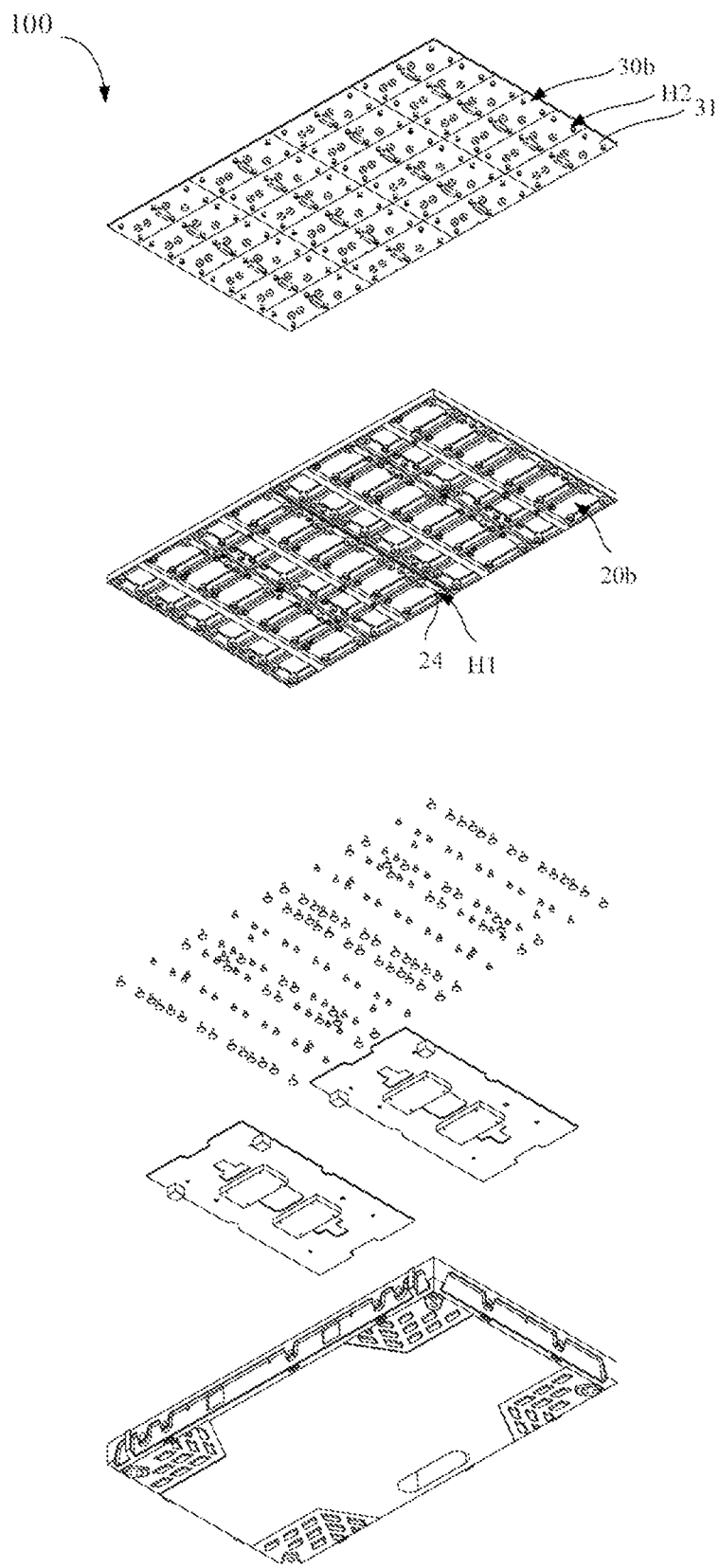
FIG. 3 is an exploded view from another angle of the splicing display device of FIG. 1.

With reference to FIGS. 1 to 3, the splicing display device 100 comprises a box body 10, a bracket 20 detachably disposed on the box body 10, a plurality of display panels 30 detachably disposed on the bracket 20, a plurality of panel fixing members 40 for fixing the display panel 30 and the bracket 20, and a plurality of bracket fixing members 50 for fixing the bracket 20 and the box body 10.

In the prior art, a plurality of display panels are directly disposed on a box body. In order to dispose a display panel, especially a small-size display panel, on a box body, and ensure flatness among the plurality of display panels, a plurality of supporting columns need to be formed on the box body. For example, in order to fix a display panel, correspondingly, six supporting columns may need to be formed on the box body. If there are too many supporting columns, they will interfere with components in the box body. In the present application, the bracket 20 is disposed between the box body 10 and the display panel 30, a plurality of the display panels 30 are fixed to the bracket 20 firstly, and then the bracket 20 is integrally fixed on the box body 10. Since the bracket 20 is formed as a whole, when the bracket 20 is fixed on the box body 10, the number of fixing members needed is less than that of fixing members for fixing a plurality of display panels 30 on the box body 10 one by one. Therefore, the number of supporting columns on the box body 10 for fixing the bracket 20 can be reduced accordingly, and interference between the supporting columns on the box body 10 and other components can be avoided under the condition of fixing the display panels 30, ensuring the flatness among the plurality of display panels.

Hereinafter, each part of the present application will be described.

Continuing to refer to FIGS. 1 to 3, the splicing display device 100 may comprise one or more box bodies 10. Although the splicing display device 100 comprising one box body 10 is illustrated in FIG. 1 described as an example, the splicing display device 100 of the present application may also comprise a plurality of box bodies 10. The arrangement and shape of the box bodies 10 can be designed according to the shape and size of the splicing display device 100. For example, when the splicing display device 100 is rectangular, the shape of the box 10 can be rectangular as shown in FIG. 1, and a plurality of rectangular box bodies 10 are disposed in a matrix, and the plurality of rectangular box bodies 10 are fixed by box body 10 fixing members (not shown) to form a rectangular splicing display device 100.

The box body 10 is used for supporting the bracket 20 and the display panels 30 disposed on the box body 10, and for accommodating other components disposed in the box body 10, such as circuit boards, wires, etc. The box body 10 comprises a bottom plate 11 and a side wall 12 disposed on the bottom plate 11. The side wall 12 is disposed in a circle around an outer periphery of the bottom plate 11 and forms a closed pattern when viewed from above. Optionally, the bottom plate 11 is rectangular, and the side wall 12 forms a closed rectangle when viewed from above. The bottom plate 11 and the side wall 12 together form a housing cavity.

At least one supporting column 13 is disposed on the bottom plate 11 of the box body 10. The supporting columns 13 are used to fix and support the bracket 20 and the display panel 30. The bottom plate 11 comprises a body portion 111 and a peripheral portion 112, and boundary between the body portion 111 and the peripheral portion 112 is shown in a dotted line. The supporting columns 13 comprise a first supporting column 131 and a second supporting column 132. The first supporting columns 131 are disposed at the peripheral portion 112 of the bottom plate 11 of the box body 10. Optionally, the first supporting columns 131 may be disposed on or adjacent an inner surface of the side wall 12. The second supporting column 132 is disposed at the body portion 111 of the bottom plate 11, that is, an inner side of the peripheral portion 112. Bracket fixing members 50 are disposed on the supporting columns 13. Alternatively, as in this embodiment, a material of the supporting columns 13 may be a magnetizable metal material, and the bracket fixing members 50 are magnetic members, such as magnets, which are magnetically attached onto the supporting columns 13. Alternatively, the bracket fixing member 50 may be a screw, and the supporting columns 13 can be provided with threaded holes in which the screw can be disposed.

The bracket 20 is used to carry a plurality of splicing display panels 30, and meanwhile assist the splicing display panel 30 to be connected to the adapter board 60 to complete driving, and to be connected to the box body 10 to complete fixing. The bracket 20 comprises a plurality of first supporting strips 21 extending in a first direction D1 and a plurality of second supporting strips 22 extending in a second direction D2. The second direction D2 intersects the first direction D1, and optionally, the first direction D1 is perpendicular to the second direction D2. The plurality of first supporting strips 21 are disposed parallel to each other at intervals in the second direction D2. The plurality of second supporting strips 22 are arranged parallel to each other at intervals in the first direction D1. The plurality of first supporting strips 21 intersect the plurality of second supporting strips 22 to form a plurality of hollow supporting units 20U. A display unit is disposed on the supporting unit 20U. Thus, a plurality of display panels 30 can be mounted on one bracket 20. Optionally, the bracket 20 may further comprise at least one auxiliary supporting strip 23 for enhancing strength of the bracket 20, preventing deformation, and functioning as a reinforcing rib. Specifically, at least one auxiliary supporting strip 23 may be parallel to the first supporting strip 21 or the second supporting strip 22 and located between two adjacent first supporting strips 21 or two adjacent second supporting strips 22. Certainly, it is also possible to dispose an auxiliary supporting strip 23 parallel to the second supporting strip 22 and an auxiliary supporting strip 23 parallel to the first supporting strip 21 at the same time. It should be noted that sine terminals on the display panel 30 disposed on the bracket 20 need to be connected to terminals on the adapter board 60 for driving, position of the auxiliary supporting strip 23 needs to avoid the terminals on the display panel 30. Further, in order to ensure flatness of a display screen spliced by a plurality of display panels 30, the bracket 20 as a whole is formed into a flat plate shape matching a splicing body of the plurality of display panels 30. It is understood that if the splicing body of the plurality of display panels 30 is arc-shaped, the bracket 20 should be correspondingly formed into arc-shape. It should be noted that the first supporting strip 21, the second supporting strip 22, and the auxiliary supporting strip 23 are collectively referred to herein as a supporting strip, and the supporting strip herein refers to at least one of the first supporting strip 21, the second supporting strip 22, and the auxiliary supporting strip 23.

A first mounting hole H1 is formed on the bracket 20 for fixing the bracket 20 and the display panel 30. Specifically, the bracket 20 comprises a first surface 20a and a second surface 20b which are disposed opposite to each other, and one surface on which the display panel 30 is mounted is the first surface 20a. A plurality of projections 24 are formed on the second surface 20b of the bracket 20. The first mounting hole H1 is formed in the protrusion 24. Further, the first mounting hole H1 penetrates the protrusion 24 and the supporting strip. The projection 24 can play roles of positioning and assisting connection. It can be understood that, in other embodiments, the first mounting hole H1 may be directly formed in the supporting strip of the bracket 20 without disposing the protrusion 24.

Moreover, the bracket 20 is provided with a convex portion for fool-proofing, and correspondingly, a groove corresponding to the convex portion is provided on the display panel 30, and the convex portion is matched with the groove to prevent the display abnormality caused by inversion of a lamp panel. The bracket 20 may be molded by die casting. Since the display panel 30 is prone to generate heat during display, the bracket 20 made of a metal material can play a role of heat dissipation.

A plurality of display panels 30 are used for displaying a picture. Through driving control, a plurality of small and medium-sized display panels 30 to be spliced together to display a complete picture. A plurality of display panels 30 are detachably disposed on the bracket 20, and are detachably disposed on the box body 10 through the bracket 20. The plurality of display panels 30 may be micro-light-emitting diode (mini-LED) display panels 30 or a sub-millimeter light-emitting diode (micro-LED) display panels 30. Since the mini-LED display panels and the micro-LED display panels are self-illuminating panels, they can also be referred to as lamp panels. The display panels may be large-sized display panels with a size such as 150×168.75, 150×112.5, etc., or a small-sized display panel with a size such as 150×56.25, etc. In this embodiment, the display panel is a small size mini-LED display panel with a size of 150×56.25.

The display panel 30 has a front surface 30a and a back surface 30b opposite to the front surface 30a. The back surface 30b of the display panel 30 is provided with a plurality of protrusions 31. The projection 31 is provided with a second mounting hole H2. The second mounting hole H2 is provided corresponding to the first mounting hole H1.

Figure 4:
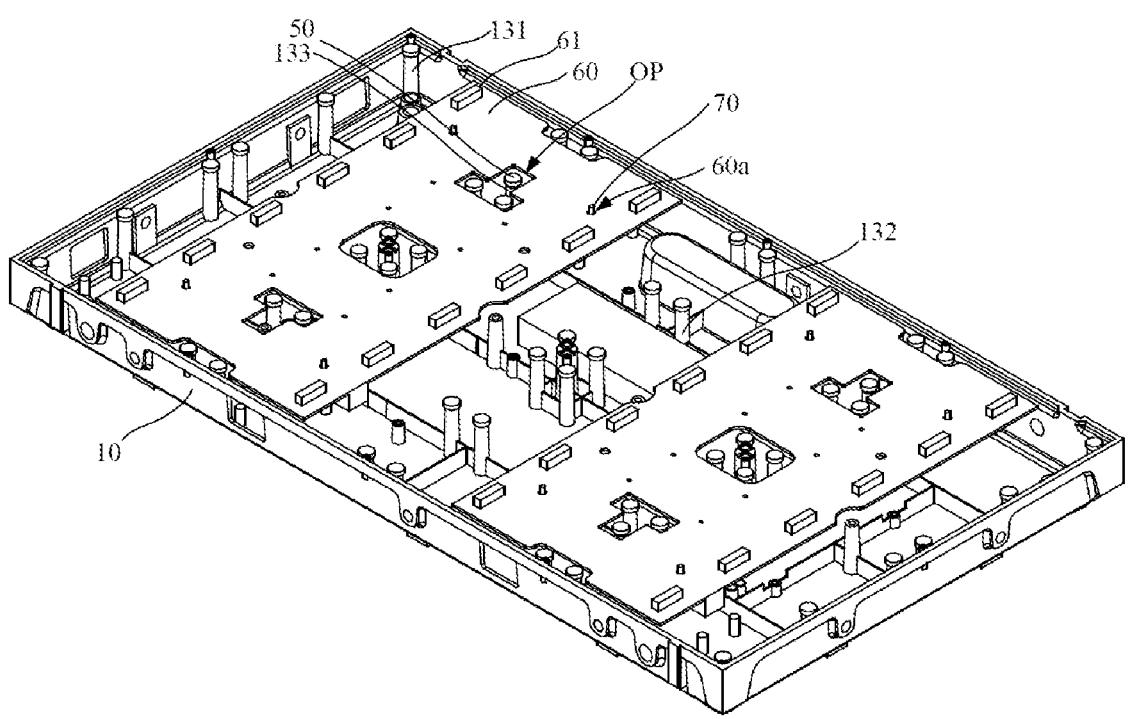
FIG. 4 is a schematic diagram of an assembly relationship between the adapter plate and the box body of the splicing display device of FIG. 1.

Optionally, the splicing display device 100 further comprises an adapter plate 60 (HUB plate) disposed between the box body 10 and the bracket 20. With reference to FIG. 4, one box body 10 can accommodate at least one adapter plate 60. Optionally, in this embodiment, one box body 10 can accommodate two adapter plates 60. The supporting columns 13 are disposed to avoid the adapter plate 60. In the present application, the term "avoid or avoiding" means that, in the case of assembly, there is no interference. Specifically, the first supporting column 131 and the second supporting column 132 are disposed around the adapter plate 60. That is, since the first supporting column 131 and the second supporting column 132 are disposed at intervals from the adapter plate 60, so that the first supporting column 131 and the second supporting column 132 do not interfere with the adapter plate 60.

Hereafter, the connection relationship between each part in the present application will be described.

The display panel 30 is detachably connected to the bracket 20. Specifically, with reference to FIG. 5, the plurality of panel fixing members 40 comprise a first fixing member 41 and a second fixing member 42, the first fixing member 41 is detachably connected to the bracket fixing member 50, and the second fixing member 42 is not connected to the bracket fixing member 50. In this embodiment, the number of bracket fixing members 50 is less than the number of panel fixing members 40. In the present application, the first fixing member 41 functions to fix the display panel 30, the bracket 20, and the box body 10, while the second fixing member 42 functions only to fix the display panel 30 and the bracket 20. The supporting column 13 can be omitted at a position of the box body 10 corresponding to the second fixing member 42, thereby preventing interference caused by the supporting columns 13. The first fixing member 41 and the second fixing member 42 are respectively disposed in the first mounting holes H1 at different positions. The first fixing members 41 are disposed corresponding to the first supporting columns 131 and the second supporting columns 132. Specifically, the bracket 20 comprises a main body portion 201 and a peripheral portion 202 disposed around the main body portion 201, and the peripheral portion 202 comprises at least a circle of supporting strips at the outermost periphery of the bracket 20. In the assembled state, the first fixing members 41 are disposed at least on a peripheral edge portion 202 of the bracket 20, and the second fixing members 42 are provided at least at the main body portion 201 of the bracket 20. It can be understood that the first fixing members 41 may be disposed on the main body portion 201 of the bracket 20, and the second fixing members 42 may be disposed on the peripheral portion 202 of the bracket 20.

The first fixing members 41 and the second fixing members 42 (panel fixing member 40) penetrate through the first mounting holes H1 and the second mounting holes H2 from the side of the bracket 20 to detachably fix the display panel 30 on the bracket 20. It can be understood that the display panel 30 and the bracket 20 may be connected by other means, for example, magnets are disposed on the bracket 20, screws are disposed on the display panel 30, and the magnets and the screws can be connected by magnetic attraction. In addition, the back surface 30b of the display panel 30 is further provided with first terminals 32 connected to the adapter board 60 for display driving and necessary electronic components 33.

Figure 5:
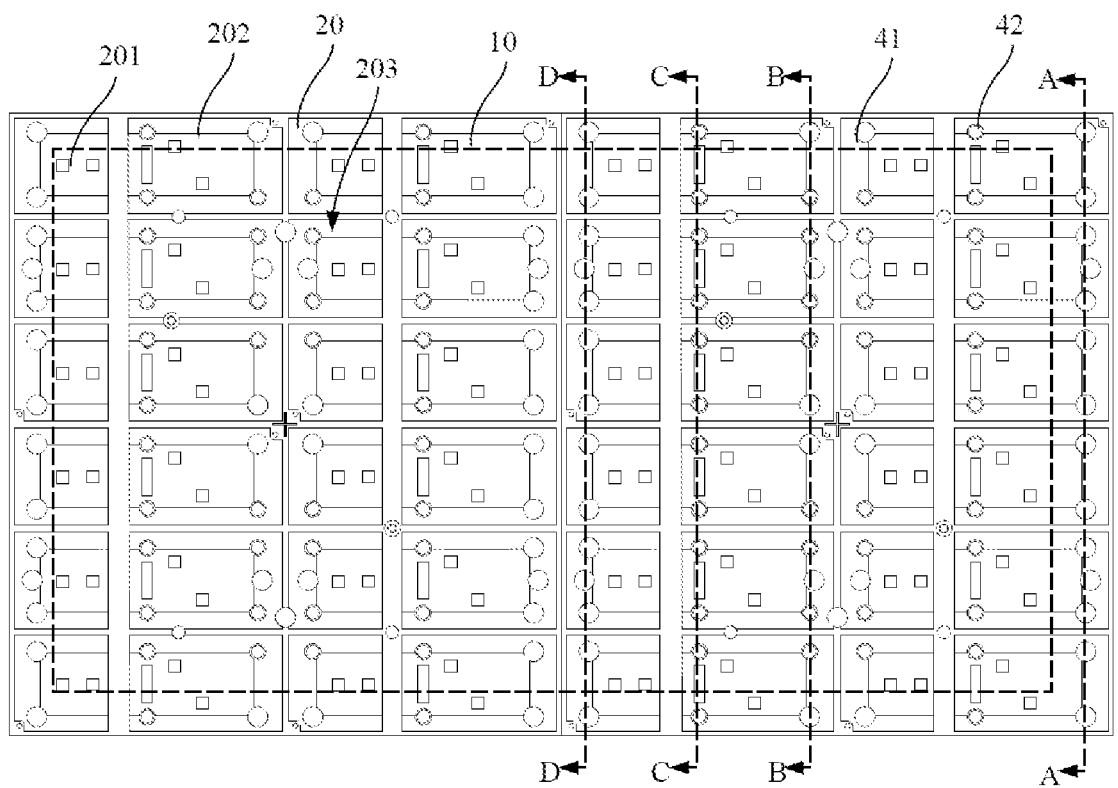
FIG. 5 is bottom view of an assembly relationship between the bracket and the display panel of the splicing display device of FIG. 1.
Figure 6:
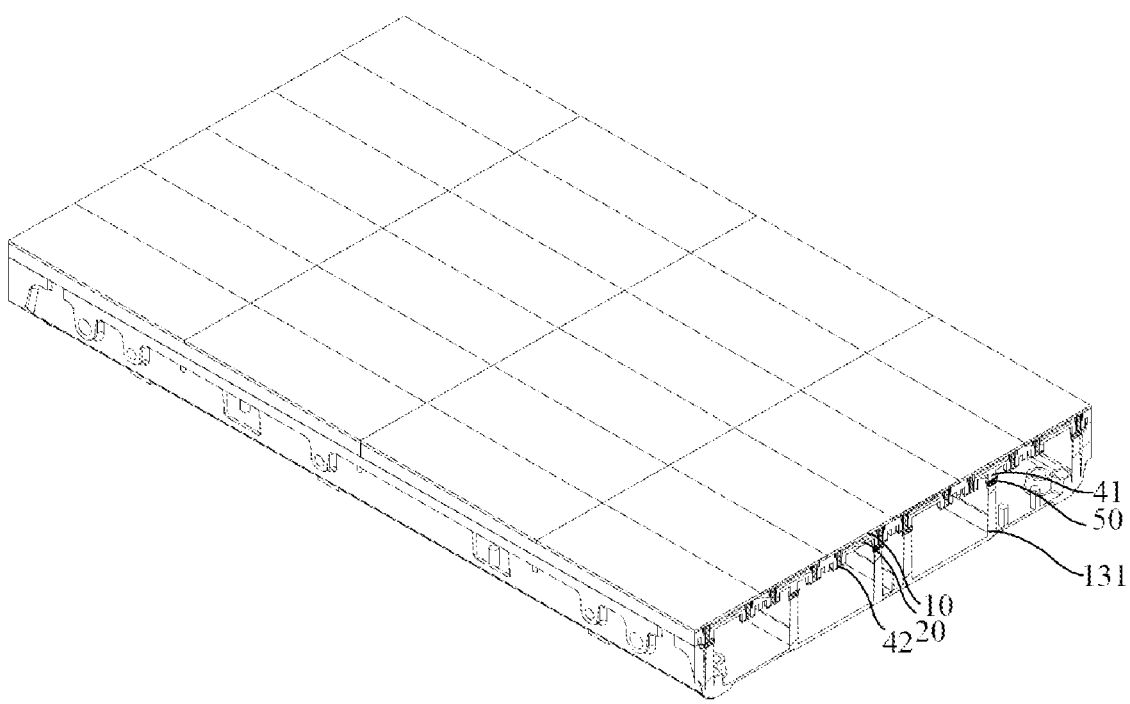
FIG. 6 is a sectional view of the splicing display device along line A-A of FIG. 5.
Figure 7:
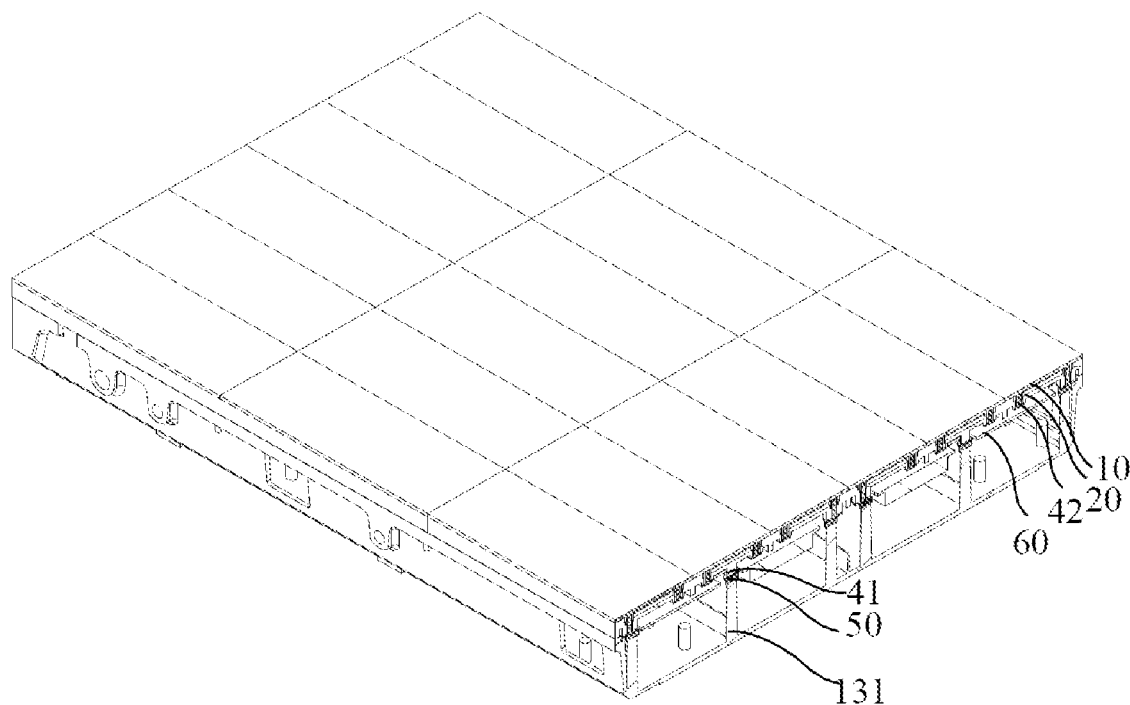
FIG. 7 is a sectional view of the splicing display device along line B-B of FIG. 5.
Figure 8:
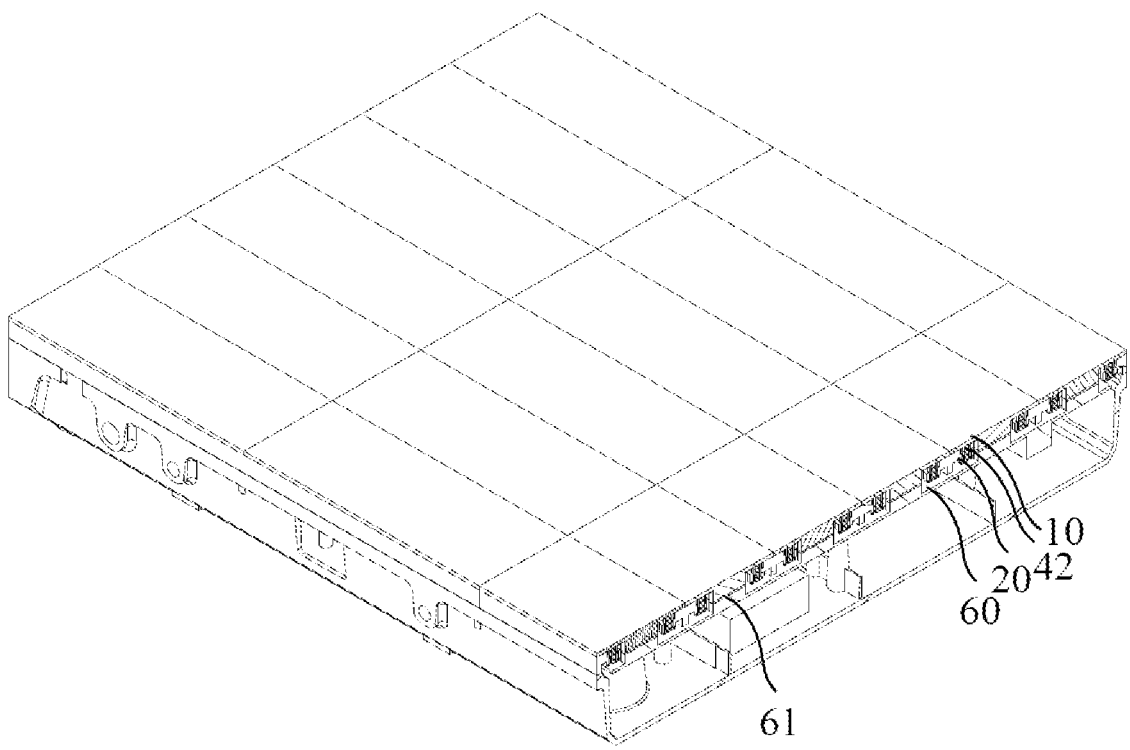
FIG. 8 is a sectional view of the splicing display device along line C-C of FIG. 5.
Figure 9:
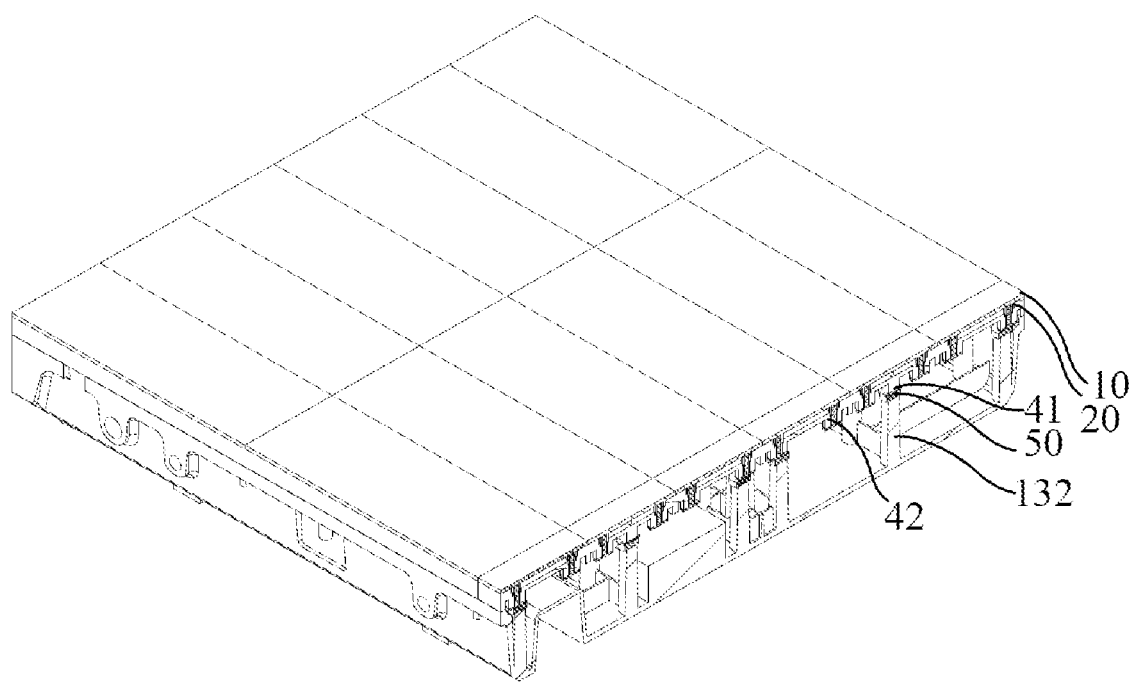
FIG. 9 is a sectional view of the splicing display device along line D-D of FIG. 5.

Specifically, in FIG. 6, along a direction of line A-A in FIG. 5, a plurality of first fixing members 41 and a plurality of second fixing members 42 located on one short side of the bracket 20 are disposed in a row in the first direction D1. In FIG. 7, along a position of line B-B in FIG. 5, a plurality of first fixing members 41 and a plurality of second fixing members 42 are arranged in a row at intervals in the first direction D1. In FIG. 8, along a position of line C-C in FIG. 5, a plurality of second fixing members 42 are arranged in a row at intervals in the first direction D1. In FIG. 9, along a position of line D-D in FIG. 4, a plurality of first fixing members 41 and a plurality of second fixing members 42 are disposed in a row in the first direction D1 in the middle of the bracket 20.

The bracket 20 is also detachably connected to the box body 10. Specifically, the bracket 20 is detachably connected to the supporting columns 13. Optionally, the bracket 20 is magnetically connected to the supporting columns 13. Continuing to refer to FIG. 6, the bracket fixing members 50 are detachably disposed on the supporting columns 13, the first fixing members 41 are detachably disposed on the bracket 20 at a position corresponding to the supporting columns 13, and the bracket fixing members 50 are magnetically connected to the first fixing members 41. At least one of the bracket fixing member 50 and the first fixing member 41 is a magnet. The first fixing member 41 may be a flat-head screw having a nut diameter of 8 mm to 10 mm A flat-head screw is disposed in the first mounting hole H1. The bracket fixing member 50 may be magnet, one end of which is disposed on the supporting columns 13 of the box body 10 by magnet-action, and the other end of which is magnetically fixed with a flat-head screw. It can be understood that the magnet may be fixed to the supporting columns 13 of the box body 10 by other means such as a double-sided adhesive. Due to limited machining accuracy of the pan-head screw and the magnet, a space in one direction of 0.3 mm-0.5 mm can be reserved between the pan-head screw and the magnet for connection. The second fixing member 42 may be a flat-head screw disposed in the first mounting hole H1. Since the first fixing member 41 needs to be connected to the supporting columns 13 on a lower box body 10, the first fixing member 41 has a stronger fixing ability than that of the second fixing member 42. Specifically, when both the first fixing member 41 and the second fixing member 42 are screws, the first fixing member 41 has a greater length than that of the second fixing member 42, and the first fixing member 41 also has a greater nut diameter than that of the second fixing member 42. Moreover, the first fixing member 41 may comprise two parts with different fixing capabilities, and the first fixing member 41 disposed on the peripheral edge portion 202 of the bracket 20 has a stronger fixing capability than the first fixing member 41 disposed on the main body portion 201. The second fixing member 42 may comprise two parts with different fixing capabilities, and the second fixing member 42 disposed on the peripheral edge portion 202 of the bracket 20 has a stronger fixing capability than the second fixing member 42 disposed on the main body portion 201. It can be understood that, in addition to the above-described magnetic connection modes, the bracket 20 and the box body 10 may be connected by other ways, for example, a groove can be disposed on an outer surface of the side wall 12 of box body case 10, and an engaging portion can be disposed on the bracket 20, so that the engaging portion can be engaged in the groove, thereby fixing the bracket 20 and the supporting column 13.

Optionally, the second fixing member 42 is disposed to avoid the adapter plate 60. The bracket 20 comprises a facing portion 203 facing the adapter plate 60. Although not shown in the figures, the facing portion 203 is a portion of the adapter plate 60 completely covered by an orthographic projection of the adapter plate 60 on the bracket 20. With reference to FIG. 8, the second fixing member 42 fixes the facing portion 203 of the bracket 20 and the plurality of display panels 30, and the second fixing member 42 is located on one side of the adapter plate 60 away from the box body 10. Optionally, the second fixing member 42 may be disposed at intervals with the adapter plate 60, or may be in contact with a surface of the adapter plate 60. The present application can prevent interference between a first connecting member and the adapter plate 60 by disposing the second fixing member 42 connecting between the portion of the bracket 20 facing the adapter plate 60 and the display panel 30 on one side of the adapter plate 60 away from the box body 10. At least one opening OP is formed in the adapter plate 60. Optionally, the adapter plate 60 has a plurality of openings OP disposed in a width direction of the box body 10. Combining with FIG. 5, a portion of the plurality of first fixing members 41 are disposed around the periphery of the bracket 20, another portion of the plurality of first fixing members 41 are disposed corresponding to a gap between adjacent adapter plates 60, and a further portion of the plurality of first fixing members 41 are disposed corresponding to an opening OP in the adapter plates 60. The plurality of first fixing members 41 are arranged in a plurality of rows in the first direction D 1. A portion of the plurality of second fixing members 42 are disposed facing the adapter plate 60. The plurality of second fixing members 42 are also disposed in a plurality of rows along the second direction D2. Two rows of second fixing members 42 are disposed above each adapter plate 60. Another portion of the plurality of first fixing members 41 are disposed around the adapter plate 60.

Optionally, the supporting columns 13 further comprise auxiliary supporting columns 133. The auxiliary supporting columns 133 play a role of assisting supporting. At least one auxiliary supporting column 133 is disposed in each opening OP. The auxiliary supporting column 133 is also disposed with a first fixing member 41 which is detachably connected to the bracket fixing member 50 in at least one opening OP. At least one opening OP is made by hollowing out the adapter plate 60, and the auxiliary supporting column 133, the first fixing member 41 and the bracket fixing member 50 are disposed in the opening OP to further enhance the connection strength between the display panel 30, the bracket 20 and the box body 10. The adapter board 60 is provided with second terminals 61 for connecting to the first terminal 32 on the display panel 30. Optionally, the adapter plate 60 is detachably fixed to the bracket 20. Specifically, at least one through hole 60a is formed in the adapter plate 60, and the splicing display device 100 comprises an adapter plate fixing member 70 which penetrates through the through hole 60a to detachably fix the adapter plate 60 onto the bracket 20.

In the assembling process of the splicing display device 100, a plurality of display panels 30a are mounted on the first surface 20a of the bracket 20a through the panel fixing member 40a, and then the adapter plate 60a is mounted on the second surface 20b of the bracket 20b through the adapter plate fixing member 70b. After the assembly is completed, the display panel 30a, the bracket 20a, and the adapter plate 60a are placed in the box body 10a, so that the bracket fixing member 50a is connected to and fixed on the first fixing member 41a.

When the display panel 30 of the splicing display device 100 of the present application fails, the bracket 20 can be removed by breaking the connection between the bracket fixing member 50 and the panel fixing member 40. The display panel 30 is fixed on the bracket 20, and then the panel fixing member 40 is removed, so that the display panel 30 can be removed for maintenance. As a whole, the splicing display device 100 of the present application is in a front maintenance mode, which is convenient for disassembly and installation.

Embodiment of the present application has been described in detail above. In the present application, specific embodiments are used to explain the principle and implementation of the present application. The foregoing descriptions of the embodiments are only merely intended to help understand the present application. At the same time, those skilled in the art can make changes in the specific implementation and application scopes according to ideas of the present application. In summary, the content of the specification should not be construed as a limitation of the present application.

What is claimed is:

1. A splicing display device, comprising:
a box body;
a bracket detachably disposed on the box body;
a plurality of display panels detachably disposed on the bracket;
a plurality of panel fixing members for fixing the display panels and the bracket;
a plurality of bracket fixing members for fixing the bracket and the box body;
wherein the plurality of panel fixing members comprise a first fixing member and a second fixing member, the first fixing member is detachably connected to the bracket fixing members, and the second fixing member is connected to only the display panels and the bracket; and
wherein the splicing display device further comprises an adapter plate disposed between the box body and the bracket, the bracket comprises a facing portion facing the adapter plate, the second fixing member fixes the facing portion and the plurality of display panels, and the second fixing member is located on one side of the adapter plate away from the box body.

2. The splicing display device according to claim 1, wherein the bracket comprises a main body portion and a peripheral portion disposed around the main body portion, the first fixing member is disposed at least at the peripheral portion of the bracket, and the second fixing member is disposed at least at the main body portion of the bracket.

3. The splicing display device according to claim 1, wherein a first mounting hole is formed on the bracket, and the display panel is formed with a second mounting hole corresponding to the first mounting hole, and the panel fixing members penetrate the first mounting hole and the second mounting hole to fix the display panel on the bracket.

4. The splicing display device according to claim 1, wherein the second fixing member and the adapter plate are disposed at intervals.

5. The splicing display device according to claim 1, wherein the box body comprises supporting columns, and the supporting columns are disposed in a manner of avoiding the adapter plate.

6. The splicing display device according to claim 5, wherein the supporting columns comprise a first supporting column disposed around the adapter plate.

7. The splicing display device according to claim 5, wherein the supporting columns comprise an auxiliary supporting column, the adapter plate is provided with at least one opening, and the first fixing member, the bracket fixing members, and the auxiliary supporting column are detachably connected in the at least one opening.

8. The splicing display device according to claim 1, wherein the adapter plate is detachably fixed on the bracket.

9. The splicing display device according to claim 1, wherein the box body comprises supporting columns, and the bracket fixing members are disposed on the supporting columns.

10. The splicing display device according to claim 9, wherein the box body comprises a bottom plate, the bottom plate comprises a body portion and a peripheral portion, and the peripheral portion surrounds the body portion, and wherein the supporting columns comprise a first supporting column and a second supporting column, the first supporting column is disposed at the peripheral portion, and the second supporting column is disposed at the body portion.

11. The splicing display device according to claim 10, wherein the splicing display device further comprises an adapter plate disposed between the box body and the bracket, and the first supporting column and the second supporting column are disposed around the adapter plate.

12. The splicing display device according to claim 11, wherein the supporting columns comprise an auxiliary supporting column, the adapter plate is provided with at least one opening, and the panel fixing members, the bracket fixing members, and the auxiliary supporting column are detachably connected in the at least one opening.

13. The splicing display device according to claim 1, wherein the first fixing member and the bracket fixing members are magnetically connected.

14. The splicing display device according to claim 13, wherein the first fixing member is a screw and the bracket fixing members are magnets.

15. The splicing display device according to claim 14, wherein the second fixing member is a screw, the first fixing member has a greater length than that of the second fixing member, and the first fixing member has a greater nut diameter than that of the second fixing member.

16. The splicing display device according to claim 1, wherein the bracket comprises a plurality of first supporting strips and a plurality of second supporting strips intersecting the first supporting strips, the first supporting strips intersect the second supporting strips to form a plurality of supporting units, and the display panel is mounted on the supporting units.

17. The splicing display device according to claim 1, wherein the bracket fixing members have a number less than that of the panel fixing members.

18. The splicing display device according to claim 1, wherein the plurality of display panels are micro-light-emitting diode display panels or sub-millimeter light-emitting diode display panels, and the display panels have a size of 150×168.75, 150×112.5 or 150×56.25.

19. A splicing display device, comprising:
a box body;
a bracket detachably disposed on the box body;
a plurality of display panels detachably disposed on the bracket;
a plurality of panel fixing members for fixing the display panels and the bracket; and
a plurality of bracket fixing members for fixing the bracket and the box body;
wherein the plurality of panel fixing members comprise a first fixing member and a second fixing member, the first fixing member is detachably connected to the bracket fixing members, and the second fixing member is connected to only the display panels and the bracket; and
wherein the first fixing member and the bracket fixing members are magnetically connected.

20. A splicing display device, comprising:
a box body;
a bracket detachably disposed on the box body;
a plurality of display panels detachably disposed on the bracket;
a plurality of panel fixing members for fixing the display panels and the bracket; and
a plurality of bracket fixing members for fixing the bracket and the box body;
wherein the bracket comprises a plurality of first supporting strips and a plurality of second supporting strips intersecting the first supporting strips, the first supporting strips intersect the second supporting strips to form a plurality of supporting units, and the display panel is mounted on the supporting units.

* * * * *